United States Patent
Shah

(10) Patent No.: US 10,243,325 B2
(45) Date of Patent: Mar. 26, 2019

(54) METHOD FOR STABILIZING ATOMIC DEVICES

(71) Applicant: QuSpin, Inc., Louisville, CO (US)

(72) Inventor: Vishal Shah, Westminster, CO (US)

(73) Assignee: Quspin, Inc., Louisville, CO (US)

( * ) Notice: Subject to any disclaimer, the term of this patent is extended or adjusted under 35 U.S.C. 154(b) by 94 days.

(21) Appl. No.: 15/422,946

(22) Filed: Feb. 2, 2017

(65) Prior Publication Data

US 2018/0219353 A1  Aug. 2, 2018

(51) Int. Cl.
*H01S 5/0683* (2006.01)
*H01S 5/06* (2006.01)
*G01R 33/26* (2006.01)

(52) U.S. Cl.
CPC ............ *H01S 5/0683* (2013.01); *G01R 33/26* (2013.01); *H01S 5/0612* (2013.01)

(58) Field of Classification Search
CPC .......... H01S 5/0014; H01S 5/005; H01S 5/02; H01S 5/06; H01S 5/0607; H01S 5/0608; H01S 5/0609; H01S 5/0611; H01S 5/0612; H01S 5/0614; H01S 5/0617
USPC ................................................. 250/251, 288
See application file for complete search history.

(56) References Cited

U.S. PATENT DOCUMENTS

| | | | |
|---|---|---|---|
| 4,662,202 A | 5/1987 | Lambert | |
| 4,833,681 A | 5/1989 | Akiyama | |
| 5,553,087 A | 9/1996 | Telle | |
| 5,606,291 A | 2/1997 | Verbanets | |
| 6,043,883 A * | 3/2000 | Leckel | ........... G01J 9/0246 356/454 |
| 6,175,579 B1 | 1/2001 | Sandford et al. | |
| 6,320,472 B1 | 11/2001 | Vanier | |
| 6,590,686 B1 * | 7/2003 | Sekiya | ........... H04B 10/503 398/182 |
| 6,888,780 B2 | 5/2005 | Happer | |
| 7,633,978 B2 | 12/2009 | Hellstrom et al. | |
| 7,664,149 B2 | 2/2010 | Diels et al. | |
| 9,595,918 B2 | 3/2017 | Li et al. | |
| 9,703,045 B2 | 7/2017 | Evans et al. | |

(Continued)

OTHER PUBLICATIONS

Gerginov et al., 2006 (V. Gerginov et al, Opt. Lett. 31, 1851 (2006).

(Continued)

*Primary Examiner* — Jason L McCormack
(74) *Attorney, Agent, or Firm* — Patricia Brzostowicz; Superior Patent Group, LLC

(57) ABSTRACT

A two-stage laser stabilization method is described to simultaneously servo two coupled laser parameters that control the wavelength of a laser, such as the laser injection current and the laser temperature, in order to simultaneously stabilize the laser frequency and output power. Two error signals are generated by passing the laser light through a frequency discriminator, such as an atomic resonance, to generate two control loops for the two coupled laser parameters. A primary control loop servos the faster laser parameter, such as the laser injection current, by direct use of the error signal. A secondary slower control loop ensures that this said error signal will remain at zero, by controlling the second laser parameter, such as the laser temperature.

2 Claims, 7 Drawing Sheets

(56) References Cited

U.S. PATENT DOCUMENTS

| | | | | |
|---|---|---|---|---|
| 2003/0011841 A1* | 1/2003 | Lee | ............... | H01S 5/0687 |
| | | | | 398/79 |
| 2004/0008743 A1* | 1/2004 | Nishimura | ......... | H01S 5/06256 |
| | | | | 372/32 |
| 2006/0280219 A1 | 12/2006 | Shchegrove | | |
| 2006/0285569 A1* | 12/2006 | Zhao | ............ | H01S 3/1303 |
| | | | | 372/56 |
| 2014/0021865 A1* | 1/2014 | Tezuka | ............ | H01S 5/0687 |
| | | | | 315/151 |
| 2014/0036940 A1* | 2/2014 | Tanaka | ............ | H01S 5/0617 |
| | | | | 372/20 |
| 2014/0320856 A1* | 10/2014 | McKeever | ......... | G01J 3/4338 |
| | | | | 356/326 |
| 2014/0327099 A1* | 11/2014 | Boudreau | ........ | H01L 27/14629 |
| | | | | 257/432 |
| 2015/0303651 A1* | 10/2015 | Mandelbaum | ........ | H01S 5/0608 |
| | | | | 372/25 |

OTHER PUBLICATIONS

Fundamentals of Cascade Control Publication, VanDoren, 2014.
Vescent Photonics, web archive of D2-125 product manual, 1 web page (saved as 11 page pdf), archived on Jun. 12, 2016, https://web.archive.org/web/20160612002100/http://www.vescent.com:80/manuals/doku.php?id=d2:laser_servo.†

\* cited by examiner
† cited by third party

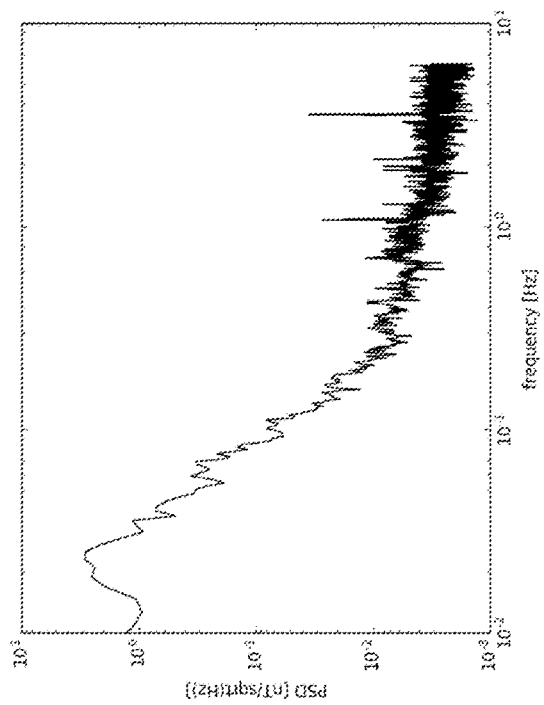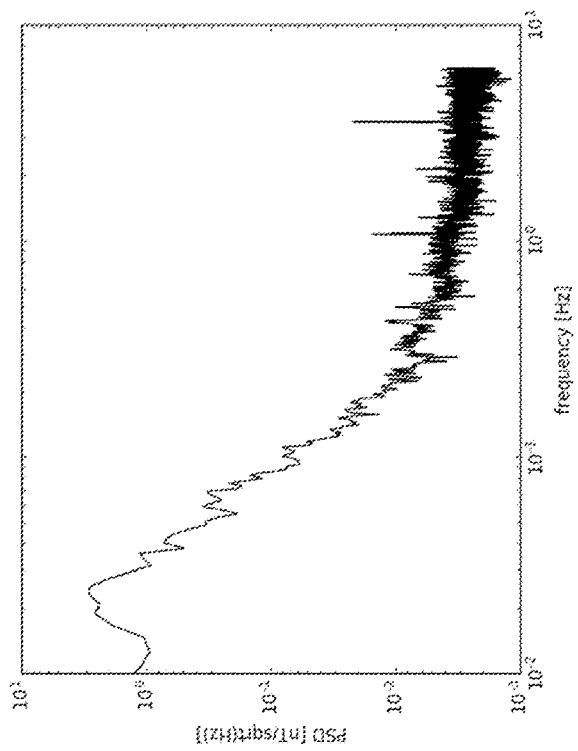
FIG. 6a
FIG. 6b

METHOD FOR STABILIZING ATOMIC DEVICES

The following application is an application for patent under 35 USC 111 (a). This invention was made with government support under HD074495 awarded by the National Institutes of Health. The government has certain rights in the invention.

FIELD OF INVENTION

This disclosure relates to the field of laser wavelength stabilization, specifically a system and method thereof.

BACKGROUND

Optically pumped atomic (OPA) devices, developed in mid-1950's, such as atomic clocks, atomic magnetometers, and atomic gyroscopes, are used in a number of scientific and advanced technology applications. The light source used for optical pumping in these OPA devices was originally a gas discharge lamp. In recent years, semiconductor lasers have become available with sufficient performance to replace the gas discharge lamps used in the conventional OPA devices. The benefits of using a laser instead of a discharge lamp include substantial reduction in size and electrical power consumption, potentially lower cost, and higher performance. However, unlike the gas discharge lamps, the wavelength of the semiconductor laser must be tuned and stabilized to the atomic resonance wavelength of interest. Miniaturization and improved reliability have led to many applications including detection of underground bombs, pipes, geophysical mapping, brain and heart imaging, and brain wave detection. In high-performance atomic devices, the stability of the laser can be of crucial importance. In order to expand the application of atomic devices, more robust, stabilized systems are needed.

Semiconductor lasers have two or more independent variables that can be adjusted to tune the wavelength of the laser. For vertical cavity surface emitting lasers (VCSEL), for example, these include: (i) the injection current which powers the laser, and (ii) the temperature of the laser diode. Each of the two variables not only affects the wavelength of the output light, but also the optical power of the output light. For high performance and high stability devices, it is necessary for both the optical power and optical wavelength to be stabilized.

In prior art, Gerginov et al., 2006 (V. Gerginov et al, *Opt. Lett.* 31, 1851 (2006)) describes a number of commonly used techniques to stabilize the laser wavelength and optical power. The two most commonly employed techniques for laser stabilization in OPA devices are briefly described below.

In one approach, a sensitive temperature sensor is mounted close to the laser diode to measure and stabilize the laser diode temperature. A wavelength error signal generated by an atomic vapor cell is used to control the laser injection current to keep the laser wavelength locked to the atomic resonance.

Due to the fast response of the laser to changes in injection current, the approach of generating the error signal using an atomic resonance to control the laser injection current enables locking the laser wavelength to the atomic resonance with high bandwidth. The downside of this approach is that only a limited tuning range is available to keep the laser wavelength locked with the laser injection current alone. If the diode laser temperature changes by more than one or two degrees, there may not be sufficient range to keep the laser wavelength locked to the resonance by changing the injection current. In addition, changes or fluctuations in the laser diode temperature when compensated by changing the injection current, changes the output power of the laser. Fluctuating optical power negatively affects the stability of the OPA device.

In another approach, the laser injection current is kept constant using a low-noise, stable current source. The wavelength error signal generated by an atomic vapor cell is used to control the laser diode temperature keeping the laser wavelength locked to the atomic resonance.

This approach provides a large tuning range to keep the laser locked to the atomic resonance and eliminates the need for an external temperature sensor for the laser. However, the downside of this approach is that depending on how the laser diode is mounted on a substrate, the thermal time constant of the laser diode heater can be very long, thereby decreasing the lock bandwidth. If the wavelength is 'tightly' locked with temperature, the lock can induce a response 'peaking' or 'hump' at the frequency of the lock bandwidth, which is often unacceptable. If the feedback loop is too loose, it can lead to low frequency drift in the output wavelength which is also undesirable. What is needed in the field is a simple and robust system and method to stabilize the laser wavelength.

SUMMARY OF THE INVENTION

The system and method described herein is broadly applicable to systems in which there are two or more independent input variables that affect the same output variable. The system and method described herein may also be particularly useful in situations in which one of the two independent input variables has a faster response but a smaller tuning range, while the second variable has slower response with a larger tuning range. These may include the injection current and temperature of a laser both affecting the laser frequency. This invention relates to a system and method to servo both laser input variables, injection current and temperature, with high bandwidth using feedback from a single source: the wavelength error signal. For purposes of the present invention, a servo system or lock may be defined as an automatic device using error-sensing negative feedback to correct performance or output of a mechanism.

The system and method of the present invention provides high bandwidth obtained from locking the first laser parameter, such as the laser injection current, as well as high dynamic range obtained from locking the second laser parameter, such as the laser temperature, to the optical resonance. Briefly describing the invention, the system includes a two stage servo lock. First stage elements lock the laser wavelength to the atomic resonance with high bandwidth using a wavelength error signal to control the first laser parameter. Second stage elements derive feedback signal from the control output of the first stage to stabilize the laser temperature, thus stabilizing both the laser parameters simultaneously. The two-stage locking system provides both, high bandwidth and high dynamic range, keeping the laser injection current and laser temperature fixed at all times, while eliminating the need for an external temperature sensor for the laser diode. In addition, the high bandwidth locking of the injection current removes the response hump resulting from the slower temperature lock.

The invention comprises, a system for stabilizing the output of a light emitting device, the system comprising: a light emitting device having at least one output parameter controlled by at least two input variables; a first discriminator capable of measuring the output parameter and generating a signal containing information about a difference between a desired and an actual value of the output parameter; a first device able to control a first input variable of the light emitting device, wherein the input variable affects the output parameter produced by the light emitting device based on the signal from the first discriminator such that the actual output parameter is equal to the desired output parameter value; a second discriminator capable of generating a signal containing information about a difference between the desired and actual value of the first input variable; a second device to receive the signal from the second discriminator controlling a second input variable of the light emitting device, such that the actual value of the first input variable is equal to desired value of the first input variable.

The invention further comprises, a method for stabilizing the wavelength and power of a light emitting device, the method comprising the steps of: using a light emitting device having at least two input variables to direct a light beam through a medium with optical properties dependent on the wavelength of the light beam; measuring wavelength of the light directed through the medium; calculating a first wavelength error by measuring the difference between the actual wavelength of the light directed through the medium and the desired wavelength of the light directed through the medium, and producing a wavelength error signal based thereon; changing a first input variable based on the wavelength error signal; calculating a second error signal by measuring the difference between the actual value of the first laser input variable and the desired value of the first laser input variable following step d, and creating a second error signal based thereon; and changing a second laser input variable based on the second error signal such that the actual value of the first input variable is equal to the desired valued of the first laser input variable.

BRIEF DESCRIPTION OF THE DRAWINGS

FIGS. 6A, 6B, and 6C are graphs of the power spectral density of the output signals of two optically-pumped magnetometers while operating with the method described here.

Before explaining the disclosed embodiments of the present invention in detail, it is to be understood that the invention is not limited in its application to the details of the particular arrangement shown, since the invention is capable of other embodiments. Also, the terminology used herein is for the purpose of description and not of limitation.

DETAILED DESCRIPTION OF THE INVENTION

Figure 1:
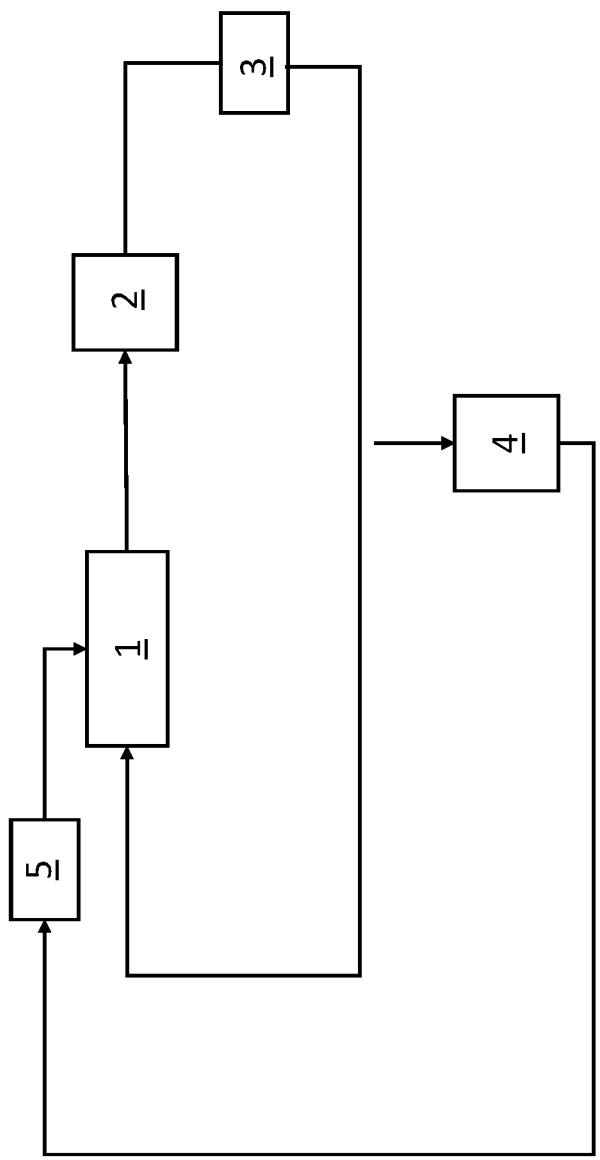
FIG. 1 is a schematic diagram illustrating the invention.

FIG. 1 is a schematic diagram illustrating the invention. A light emitting device 1 has an output parameter. A detector 2 receives the output parameter and generates a signal based on the difference between the actual value of the output parameter and a desired value. A first device 3, capable of generating an input to the light emitting device thereby affecting the output parameter, receives the signal from the detector 2. The first device 3 thereby changes its signal, a first input variable, to the light emitting device 1 in such a manner as to cause the output parameter to have the desired value. A second discriminator 4 measures the difference between the actual first input variable and a desired first input variable and creates a second input variable. The second input variable is fed to a second device 5 also capable of input to the light emitting device 1. Based on the second input variable the second device 5 changes its signal to the light emitting device 1 such that the first input variable is the desired value. As a result, both the value of the output parameter of the light emitting device and the value of the first input parameter of the light emitting device remain at the desired values.

Figure 2:
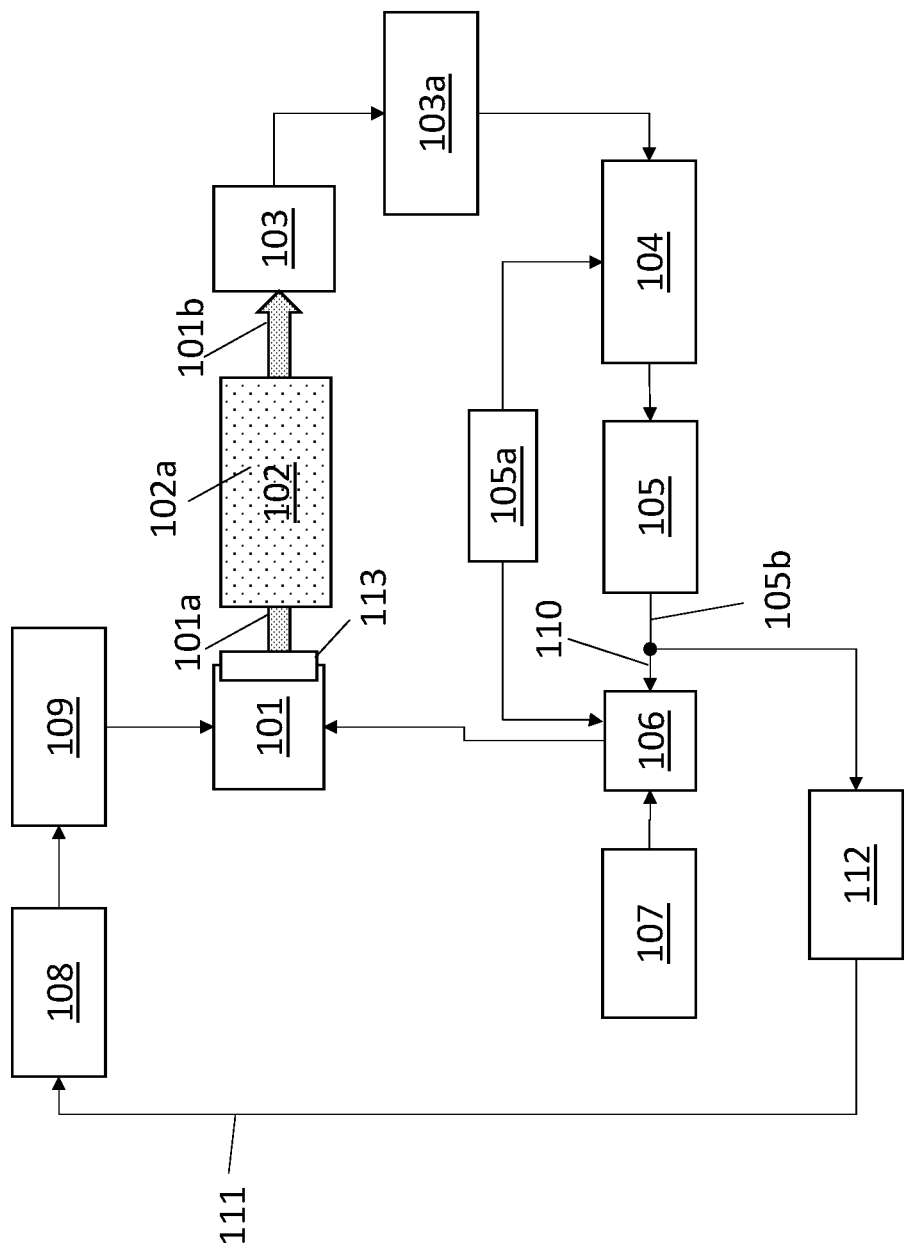
FIG. 2 is a schematic diagram illustrating several components employed in an embodiment of the system and method for stabilizing an atomic device as described herein.

FIG. 2 represents a schematic diagram of one embodiment of the system and method for laser stabilization based on the present invention. In FIG. 2, a light emitting device 101, such as a semiconductor diode laser, which may be a vertical cavity surface emitting laser (VCSEL) or other laser or light emitting device, produces a beam 101a, whose wavelength can be tuned by changing the laser diode injection current, or other energizing means, temperature, optical pathlength, and perceivably other input variables of the light emitting device. Laser emitting devices are generally powered by electric current and are housed in a cavity, therefore varying injection current and temperature of the cavity are often used to affect the beam generated. Further, the laser may contain or be fitted with a light altering device such as intensity or a wavelength modulator 113.

The beam 101a generated by the laser passes through a vessel 102 containing a frequency discriminator 102a, which may be atoms or molecules in the vapor phase of a desired species. Example of frequency discriminators 102a include rubidium, cesium, iodine, or any atom or molecule the laser is resonant with. It can also be envisioned that the vessel 102 is the frequency discriminator 102a and may be an optical cavity resonant with the laser wavelength. Since wavelength and frequency are related, a frequency discriminator can also be referred to as a wavelength discriminator. Alternately this may be a polarization discriminator. The temperature of the vessel 102 or part thereof may be adjusted to change the atomic density of the frequency discriminator 102a in the vessel 102 to a desired value.

The light transmitted 101b through the frequency or wavelength discriminator 102a falls on a photodetector 103 which generates an electrical current proportional to the light power falling on the photodetector 103. When the frequency discriminator 102a has a resonance at the same wavelength as the light, the light beam 101a is absorbed and light beam 101b falls to lower emittance. An amplifier 103a may be used to convert electrical current generated by the photodetector 103 to a measurable voltage signal. Discriminators that change input to the light or laser may be wavelength discriminators, polarization discriminators, or optical power discriminators.

Figures 3A, 3B:
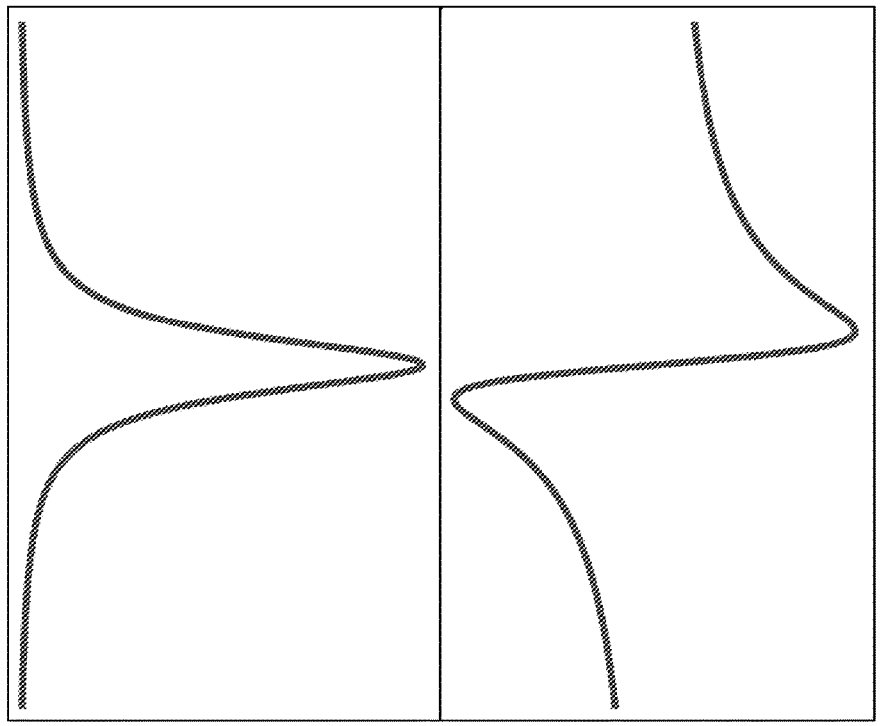
FIG. 3A is a graph of a photodiode output as a function of the laser frequency.
FIG. 3B is a graph of a lock-in amplifier output as a function of a laser frequency.

When the wavelength of the laser light 101a is equal to the wavelength of the atomic resonance, laser light passing through the vessel 102 is absorbed by the atomic vapor 102a confined in said vessel 102. Scanning the optical wavelength across the atomic resonance produces an output following the well-known Gaussian or Lorenztian atomic resonance line shape which can be observed by plotting the voltage output of the amplifier 103a as a function of optical wavelength (changed by temperature, current, or other means) as illustrated in FIG. 3A.

The optical wavelength of the laser device 101 can be tuned or adjusted by changing the laser injection current supplied by the DC current supply 107, or by changing the laser diode temperature using laser temperature controller 108, connected to a heater 109. A small AC current from a signal generator 105a is added to the laser injection current to create a laser current. The modulation of the laser current produced by the AC current of the signal generator 105a modulates the wavelength of the output light. As it is well known in prior art, with synchronous phase detection using a lock-in amplifier 104 referenced to the signal generator 105a, a wavelength error signal can be generated, whose line shape resembles the first-order derivative of the atomic resonance line shape as shown in FIG. 3B.

Using the wavelength error signal, a servo high-speed negative feedback loop, or primary lock 110, can be implemented to keep the laser wavelength locked over the center of the atomic resonance. As used herein primary lock 110 is the fast feedback loop, in this implementation controlling the laser injection current. The primary lock alternatively may be the slow feedback loop. To setup up the primary lock 110, the laser wavelength error signal from the lock-in amplifier 104 is conditioned with appropriately chosen gain parameters from a servo controller 105. The output of the laser controller 105 is the laser control signal 105b and it is added to the current from the DC power supply 107 with a signal combiner 106, such that the laser control parameter or servo controller 105 adds or subtracts from the preset DC current, as required to keep the wavelength stable to the atomic resonance. It is expected that other input variables including alternate energizing means and control of optical path length could be used as input variables.

With the primary lock 110 engaged, the loop changes the injection current in response to temperature changes in a way that keeps the laser wavelength constant in reference to the atomic resonance. This also changes the laser output power. To remedy induced changes in laser power by the primary lock, a secondary lock 111, described below, is implemented to keep the laser power constant by maintaining the laser injection current near an optimal preset value.

The secondary lock 111, described herein as a secondary slower-speed feedback loop, controls the temperature of the laser in a way that it zeros the servo output of the primary lock 110. The invention encompasses instances where the fast and slow loops are reversed in order, the primary being the slow, and the secondary being the fast. For this example, wherein the secondary lock 111 is the slow-speed feedback loop, the servo output of the primary lock is used as the input signal for the secondary lock 111. The input signal of the secondary lock is conditioned with appropriately chosen gain parameters with a secondary servo controller 112 and is used to adjust the temperature of the laser in a way that keeps the servo output of the primary lock at zero.

In this way, the primary lock 110 keeps the laser wavelength tightly locked over the atomic resonance with high bandwidth by feeding back to the laser injection current, and the secondary lock 111 stabilizes the temperature by ensuring that the injection current of the laser does not deviate from its initial preset value. With the primary and secondary locks effectively cross-stabilizing the system, both laser power and wavelength are stabilized with high bandwidth and large dynamic range without any external means to measure the laser temperature.

It should be understood that those skilled in art may create other embodiments of the apparatus. It should be noted that the configuration depicted in FIGS. 1 and 2 are provided for purposes of illustration, and are not intended to be limiting. The first wavelength error generator signal may control the temperature while the second may control the injection current of the laser, or vice versa. Other light input variables may be used to control the output of the laser or light beam. Other devices and/or device configurations may be utilized to carry out the operations described herein. It can be envisioned that technology advances in the field may lead to variations of laser, atomic devices, type of atom or molecule or device used as a frequency or wavelength discriminator, temperature of the vapor, electrical, and/or heat devices that may not be known at this time. The method of providing a stable laser output may be applicable to varied systems including but not limited to atomic clocks, magnetic and electric field sensors, gyroscopes, accelerometers, and reference standards, such as temperature, current, wavelength, or voltage standards.

EXAMPLES

Example 1

Figure 4:
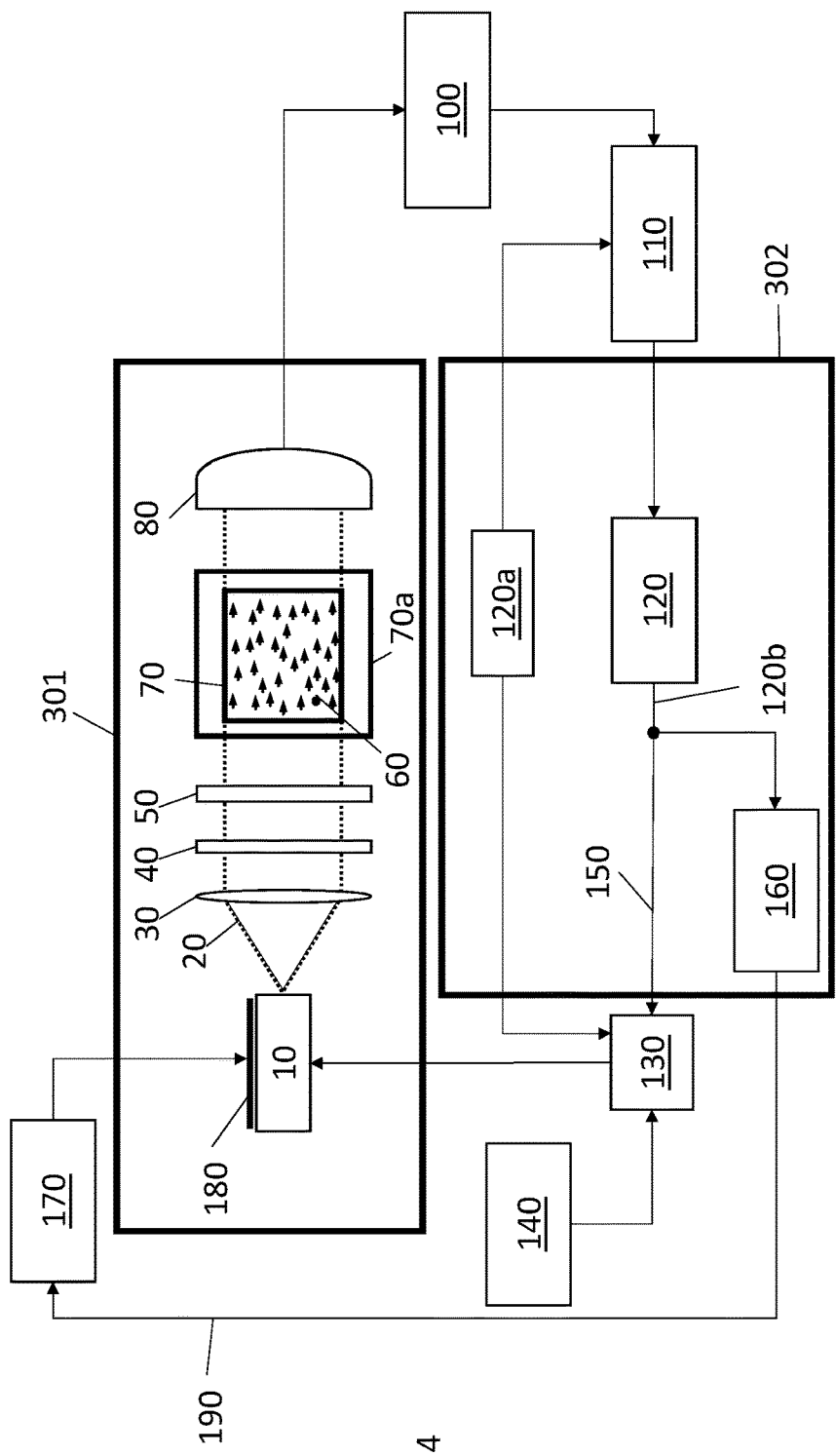
FIG. 4 is a schematic diagram illustrating an optically-pumped atomic device as an embodiment of the system and method for stabilizing the laser frequency.

As an example, a rubidium optically-pumped atomic (OPA) device has been constructed. A schematic diagram of the OPA device is shown in FIG. 4. For purposes of illustration, the top box 301 encloses the sensor optical components. The bottom box 302 encloses modulator 120a, the PID servo controller 120 and a second PID servo controller 160. A laser diode 10, such as a vertical cavity surface emitting laser, was mounted on a baseplate with a small resistive electrical heater 180 placed in close proximity to the laser diode 10. The light beam 20 was collimated by an optical lens 30, and the polarization of the light was adjusted for optimal performance of the OPA device with a waveplate 50. The intensity of the was also adjusted for optimal performance of the OPA device with an absorptive filter 40. The laser light was directed towards a sealed, transparent glass vessel or vapor cell 70 containing a vapor of rubidium metal 60. The rubidium vapor cell 70 was placed inside an oven 70a to increase and control the density of rubidium metal in the vapor. The temperature set-point of the oven 70a was adjusted for optimal performance of the OPA device. A Si-PIN photodiode 80 collects the laser light transmitted through the vapor cell. A transimpedance amplifier 100 is used to convert the current output of the photodiode to a measurable voltage.

Figure 5:
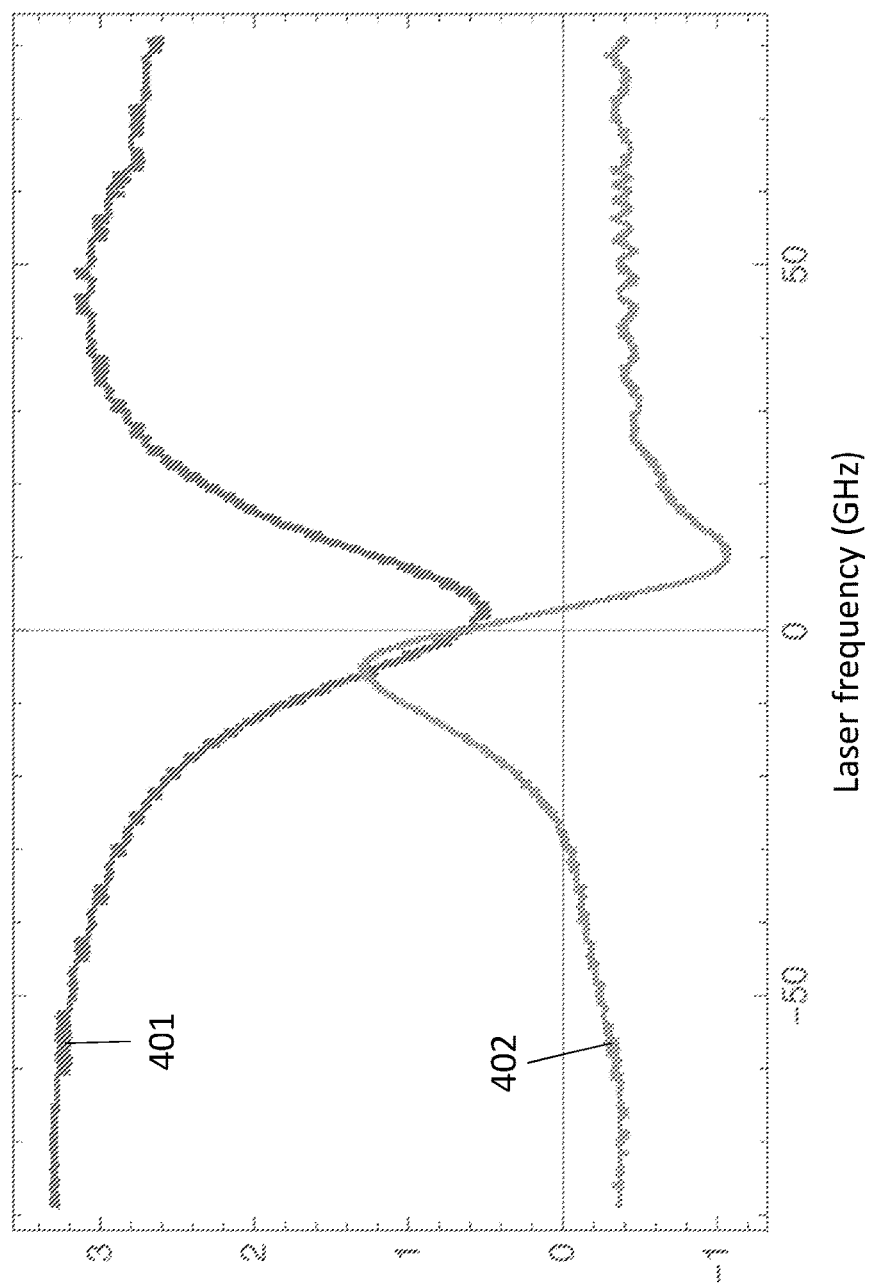
FIG. 5 is a graph of a photodiode output and lock-in amplifier output as a function of a laser frequency.

The laser temperature and laser injection current were adjusted such that the wavelength of the output light 20 is equal to the optical resonance wavelength of the atoms 60 in the vapor cell 70. For example, if the atomic transition of interest in the OPA device is the $5^2S_{1/2} \rightarrow 5^2P_{1/2}$ (D1 line) of rubidium atoms, the laser wavelength was adjusted to be equal to 794.98 nm. When the wavelength of the laser was equal to 794.98 nm, the rubidium atoms 60 in the vapor cell 70 absorbed laser light. In turn, this decreased the amount of light falling on the photodetector 80 which results in a smaller current generated by the photodetector 80. The transimpedance amplifier 100 at the output of the photodiode produced a smaller voltage in response to a smaller output current. Sweeping the injection current centered around 794.98 nm produced a Lorentzian or Gaussian resonance 401 as shown in FIG. 5.

To lock the laser wavelength at the center of the atomic resonance, a small modulation signal 120a was added to the laser injection current. The amplitude of the current modulation was adjusted such that the induced modulation of the laser wavelength is a fraction of the atomic resonance width. The frequency of the current modulation can typically range from few hundred Hz to several hundred kHz or more. With synchronous lock-in detection using the modulation signal 120a as the reference, the first harmonic output of the lock-in amplifier 110 was used as an error signal for a feedback loop to lock the laser wavelength at the atomic resonance. Sweeping the injection current centered around 794.98 nm produced a signal at the output of the lock-in amplifier 402 as shown in FIG. 5. The error signal was conditioned with appropriately chosen polarity and proportional, integral, and differential gains using a (proportional-integral-differential) PID servo controller 120. The output of the PID controller was a current which was added by a signal combiner 130 to the injection current generated by a DC current source 140, forming a closed-loop system which keeps the laser wavelength locked at the center of the atomic resonance with a fast loop bandwidth. This feedback loop, which derives the input signal from the laser wavelength error signal, was referred to as the primary lock 150. The primary lock 150 ensured that the laser wavelength matches the atomic resonance wavelength, and to do so it modified the laser injection current as needed. While the primary lock 150 ensured that the wavelength is held constant, the output power of the laser was unconstrained.

To constrain the laser power, a secondary feedback loop 190 was implemented. For this the temperature of the laser diode was continuously adjusted within a slower negative feedback loop 190, so that the average value of the control signal of the primary loop 120b remains zero. This ensured that the laser injection current remained near the value set by the DC current source 140, while at the same time the primary lock 150 kept the laser wavelength equal to the wavelength of the rubidium transition. The secondary control loop 190 was implemented by splitting the control signal 120b generated by the PID servo controller 120. One part was added to the laser DC injection current (primary lock 150). The other part was routed to a second PID servo controller 160 set to a lower loop bandwidth. This second controller generated a control signal for the laser temperature controller 170, which steered it to the point where the control signal of the primary control loop 150 averages to zero. In this way, both, the laser wavelength followed the atomic wavelength with a fast loop bandwidth, while the laser output power remained constant with high dynamic range and a slower loop bandwidth.

Figure 6C:
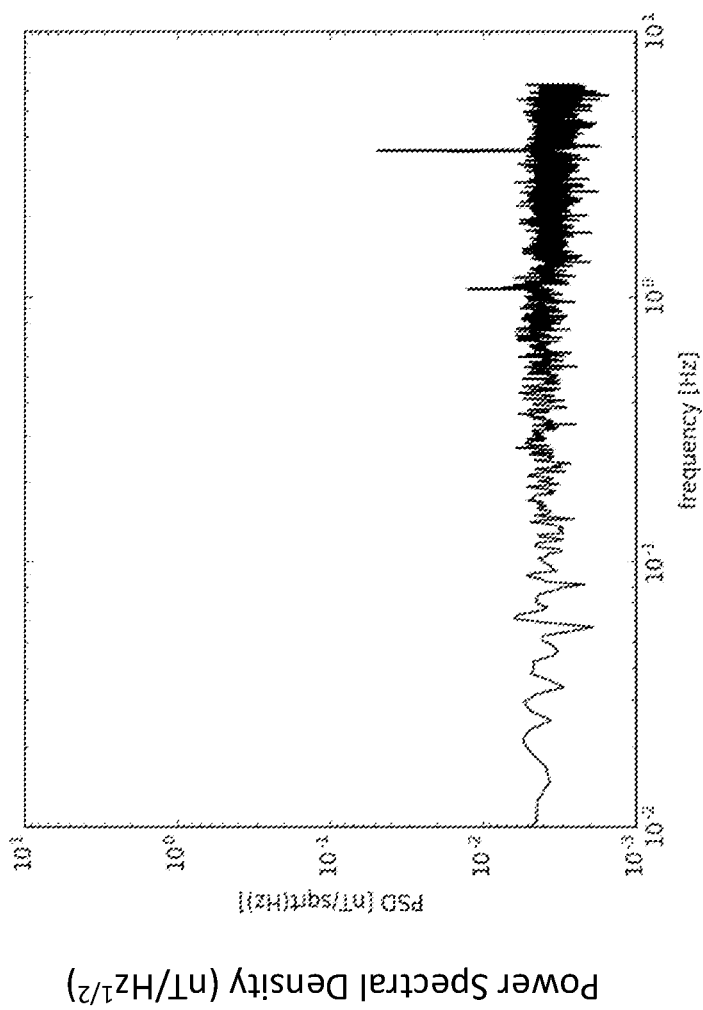

Using this method two optically pumped magnetometers were implemented and their output signals were measured over several hours outside the laboratory. During this time the outside temperature varied by several degrees but the output of the magnetometers remained free of temperature induced drift, indicating that the laser wavelength and optical power remained stable. By implementing the method described here, the output signals of the two independent devices remained correlated to a very high degree over long times. FIGS. 6A, 6B, and 6C show the power spectral density of the output signals of the two magnetometers MAG-1, as in FIG. 6A, and MAG-2, as in FIG. 6B. As the ambient field changed, the output signals changed, seen by the rise in power spectral density at low frequencies. When calculating the power spectral density of the difference of the two output signals, it remained flat, as shown in FIG. 6C, down to very low frequencies, showing that the laser frequencies of the two lasers in the two magnetometers remained constant, even with ambient temperature changes.

Example 2

The above example described how the present invention was used as a laser wavelength reference for atomic devices. In this embodiment, the system stabilizes the laser wavelength to an optical cavity instead of an atomic vapor. These systems often require a fast feedback loop, since the cavity has a very narrow linewidth and larger drift compared to many atomic resonances. However, several lasers can be used, such as but not limited to Fabry-Perot lasers, vertical-cavity surface-emitting lasers, distributed feedback lasers, and distributed Bragg reflector lasers.

When the laser is frequency-locked to the side of a cavity fringe, the actual output frequency can change when the laser power fluctuates and therefore it is important to keep the laser power constant as well. For example, a Fabry-Perot laser may be locked to the side of a cavity fringe. The laser frequency can be tuned fast over small discursions with the laser injection current and slowly over a wide range of frequencies by changing the voltage of a piezoelectric transducer on the extended-cavity grating.

The laser beam may be collimated and coupled into an optical cavity. The transmitted or reflected light is detected with a photodetector and the electrical current is converted to a voltage with a transimpedance amplifier. This output signal is conditioned by a (proportional-integral-differential) PID servo controller to produce an error signal with appropriately chosen offset, polarity, and proportional, integral, and differential gains. This error signal produces a current that is added to the DC current of the laser and can provide fast frequency tuning. This feedback lock represents the primary lock. In a secondary lock, a part of the output signal from the PID servo controller used in the primary look is sent into a secondary PID servo controller. This controller produces an appropriate error signal, which is used to steer the grating of the extended-cavity diode laser to the point, where the output signal of the primary lock is zero. The secondary loop is slower, but provides a wider tuning range.

Example 3

The above described system and method may be used to stabilize a magnetic field in space using electromagnetic coils with high bandwidth as well as with a large dynamic range. The dynamic range refers to the maximum magnitude of the field that the electromagnetic coil system can generate, and bandwidth relates to the maximum rate at which the electromagnetic coils can respond. A magnetic sensor may be used to measure the original magnetic field in the region of interest. If the original field is high or low compared to a desired value, the electromagnetic coils can be energized appropriately to adjust the field value to the desired level. Thus, an electronic feedback loop can be established using the magnetic sensor and electromagnetic coil system to lock the magnetic field to a desired value in a region around the sensor.

To achieve a large dynamic range, an electromagnetic coil with a large number of turns can be utilized. However, coils with large number of turns have correspondingly larger inductances, which limits the speed with which the electromagnetic coils can respond to stabilize the field (limited bandwidth). Thus, to achieve high speed, a secondary coil can be used, which has fewer turns and consequently lower inductance. The coil with smaller number of turns can generate a rapidly changing field but the total strength of the field generated by the coil is smaller.

Using the method described here, two separate feedback loops can be implemented to stabilize the field with both, a high speed and a high dynamic range. The first coil has larger number of turns and generates larger but slowly changing fields. The second coil generates fast changing fields but of smaller magnitude. The output of the sensor, subtracted from the desired field value, can be used as an error signal to stabilize the field to the desired value. The error signal, conditioned with appropriately chosen gain values, can be utilized to implement a feedback loop to the second coil, to stabilize the field value with high bandwidth, albeit with small dynamic range (Primary Lock). A secondary feedback loop can be implemented next, which derives its input 'secondary error signal' from the output of the servo control signal from the Primary lock. Again, after conditioning the secondary error signal with appropriately chosen servo gains, the first coil can be controlled to implement a secondary feedback loop (Secondary Lock), which stabilizes the field value with smaller bandwidth but larger dynamic range.

Thus, the Primary Lock corrects high speed field fluctuations, while the Secondary Loop keeps the current in the second coil within range by adjusting current through the first coil in a way that nulls the DC current through the second coil.

It should be noted that the examples described above are provided for purposes of illustration, and are not intended to be limiting. Other devices and/or device configurations may be utilized to carry out the operations described herein. The system can furthermore be implemented without phase-sensitive detection, when appropriate error signals can be generated from the transmitted laser light. It can be envisioned that technology advances in the field may lead to variations of atomic devices that may not be known at this time. The method of providing a stable laser output may be applicable to varied systems including but not limited to atomic clocks, magnetic and electric field sensors, gyroscopes, accelerometers, communication systems, and reference standards, such as temperature, current, wavelength, or voltage standards.

I claim:

1. A system for stabilizing the output of a light emitting device, the system comprising:
   a. a laser diode producing light, the light having a wavelength controlled by at least two input variables, a temperature of the laser diode and an energizing current supplied to the laser diode;
   b. a detector and a first discriminator capable of measuring the wavelength and generating a first signal containing information about a difference between a desired and an actual value of the wavelength;
   c. a first device able to control the energizing current supplied to the laser diode, wherein the energizing current supplied to the laser diode affects the wavelength based only on the first signal from the first discriminator such that the wavelength becomes equal to the desired wavelength value;
   d. a second discriminator capable of generating a second signal containing information about a difference between a desired and actual value of the energizing current supplied to the laser diode;
   e. a second device to receive the second signal from the second discriminator, wherein the second device is able to control the temperature of the laser diode based on the second signal such that the actual value of the energizing current is equal to the desired value of the energizing current; and
   f. wherein a temperature sensor is not required for operation of the system.

2. A method for stabilizing the wavelength and power of a light emitting device, the method comprising the steps of:
   a. using a laser diode with wavelength controlled by at least two input variables, temperature and input current, to direct a light beam through a medium with optical properties dependent on a wavelength of the light beam;
   b. measuring the wavelength of the light directed through the medium;
   c. measuring the difference between the actual wavelength of the light directed through the medium and the desired wavelength of the light directed through the medium, and producing a wavelength error signal based thereon;
   d. changing an input current based only on the wavelength error signal;
   e. measuring the difference between the actual input current and the desired input current, and creating a second error signal based thereon;
   f. changing the temperature based on the second error signal such that the actual value of the actual input current is equal to the desired value of the input current; and
   g. wherein a temperature sensor is not required for operation of the method.

* * * * *